(12) United States Patent
Herner

(10) Patent No.: US 8,198,144 B2
(45) Date of Patent: Jun. 12, 2012

(54) PILLAR STRUCTURE FOR MEMORY DEVICE AND METHOD

(75) Inventor: Scott Brad Herner, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 13/158,231

(22) Filed: Jun. 10, 2011

(65) Prior Publication Data

US 2011/0312151 A1    Dec. 22, 2011

Related U.S. Application Data

(60) Provisional application No. 61/354,166, filed on Jun. 11, 2010.

(51) Int. Cl.
*H01L 21/00*  (2006.01)
*H01L 21/82*  (2006.01)
*H01L 21/332* (2006.01)
*H01L 21/336* (2006.01)

(52) U.S. Cl. ............ 438/133; 438/3; 438/128; 438/135; 438/257; 438/478; 257/E21.233; 257/E21.41; 257/E21.476; 257/E21.645

(58) Field of Classification Search ........... 257/E21.233, 257/E21.41, E21.476, E21.645
See application file for complete search history.

(56) References Cited

U.S. PATENT DOCUMENTS

| | | | |
|---|---|---|---|
| 7,102,150 B2 | 9/2006 | Harshfield | |
| 7,479,650 B2 | 1/2009 | Gilton | |
| 2007/0105284 A1 | 5/2007 | Herner | |
| 2009/0014707 A1 | 1/2009 | Lu et al. | |
| 2009/0321789 A1* | 12/2009 | Wang et al. | ............. 257/202 |
| 2010/0219510 A1* | 9/2010 | Scheuerlein et al. | ......... 257/618 |
| 2011/0227028 A1* | 9/2011 | Sekar et al. | ................ 257/4 |

OTHER PUBLICATIONS

International Search Report for PCT/US2011/040090 filed on Jun. 10, 2011.
Written Opinion for PCT/US2011/040090 filed on Jun. 10, 2011.

* cited by examiner

*Primary Examiner* — Mohsen Ahmadi
(74) *Attorney, Agent, or Firm* — Ogawa P.C.

(57) ABSTRACT

A method of forming a memory device. The method provides a semiconductor substrate having a surface region. A first dielectric layer is formed overlying the surface region of the semiconductor substrate. A bottom wiring structure is formed overlying the first dielectric layer and a second dielectric material is formed overlying the top wiring structure. A bottom metal barrier material is formed to provide a metal-to-metal contact with the bottom wiring structure. The method forms a pillar structure by patterning and etching a material stack including the bottom metal barrier material, a contact material, a switching material, a conductive material, and a top barrier material. The pillar structure maintains a metal-to-metal contact with the bottom wiring structure regardless of the alignment of the pillar structure with the bottom wiring structure during etching. A top wiring structure is formed overlying the pillar structure at an angle to the bottom wiring structure.

36 Claims, 12 Drawing Sheets

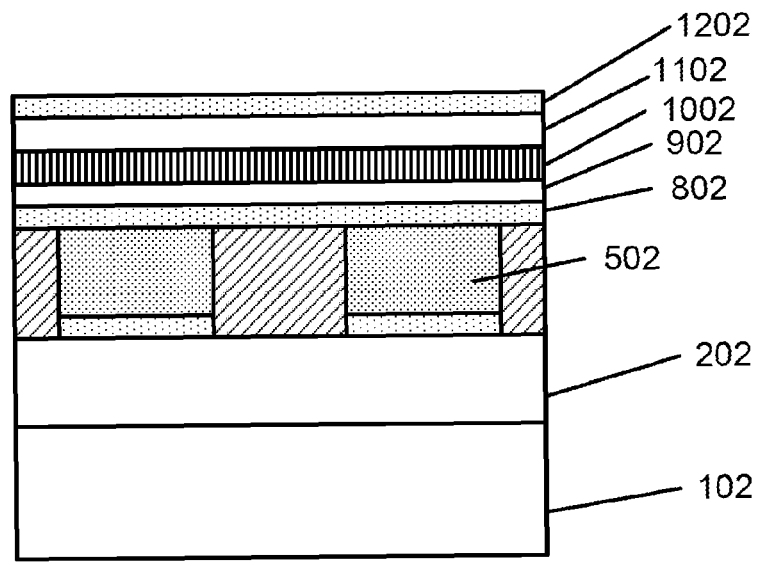
Fig. 12
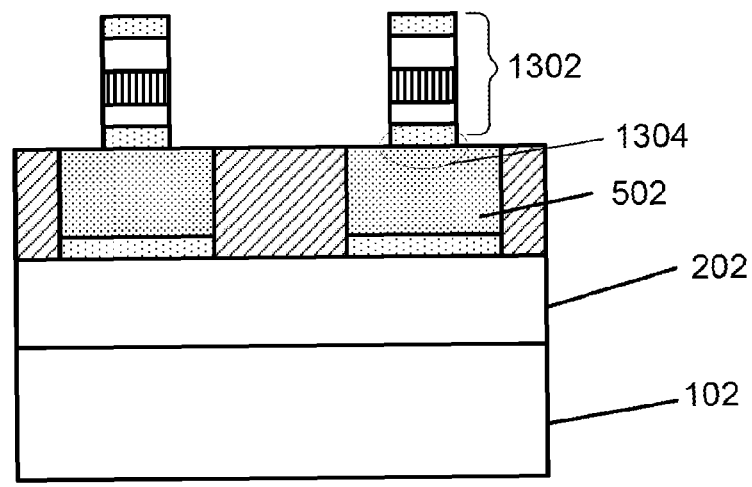
Fig. 13
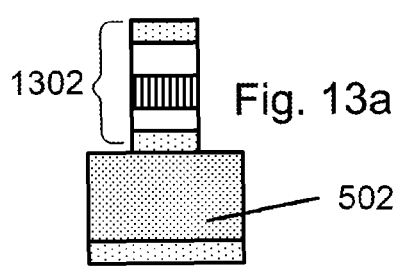 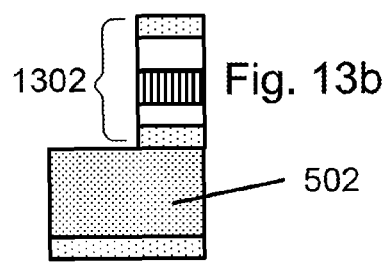

PILLAR STRUCTURE FOR MEMORY DEVICE AND METHOD

BACKGROUND

The present invention is related to switching devices. More particularly, the present invention provides a structure and a method for forming a non-volatile resistive switching memory device having desirable characteristics.

The success of semiconductor devices has been mainly driven by an intensive transistor down-scaling process. However, as field effect transistor (FET) approach sizes less than 100 nm, problems such as short channel effect start to prevent proper device operation. Moreover, transistor based memories such as those commonly known as Flash can have additional performance degradations as device sizes shrink. For example, a high voltage is usually required for programming of a Flash memory device. The high voltage can result in dielectric breakdown and increases the possibility of disturb mechanisms. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures coupled with a silicon-based device to form a memory cell. However, these new memory cells usually lack one or more key attributes, which have prevented their widespread adoption in high volume products. For example, Fe-RAM and MRAM devices have fast switching characteristics, that is, the time to switch between a "0" and a "1," and good programming endurance, but their fabrication is not compatible with standard silicon fabrication, and the resulting memory cell may not be easy to scale to small sizes. Switching for a PCRAM device uses Joules heating, which inherently has high power consumption. Organic RAM or ORAM is incompatible with large volume silicon-based fabrication and device reliability is usually poor.

From the above, an improved semiconductor memory device that can scales to smaller dimension and techniques are therefore desirable.

BRIEF SUMMARY OF THE PRESENT INVENTION

The present invention is directed to memory devices. More particularly, embodiments according to the present invention provide a method to form a plurality of pillar structures for an array of switching devices. The pillar structures allow for fabrication of high density memory. The method has been applied to non-volatile memory device, but it should be recognized that embodiment according to the present invention can have a much broader range of applicability.

In a specific embodiment, a method for forming a pillar structure for a switching device is provided. The method includes providing a semiconductor substrate having a surface region and forming a first dielectric layer overlying the surface region of the semiconductor substrate. A bottom wiring structure is formed overlying the first dielectric layer. In a specific embodiment, the bottom wiring structure includes at last a first conductor material, such as a metal material. A second dielectric material is formed overlying the top wiring structure. In a specific embodiment, the second dielectric material is planarized to expose a bottom wiring structure surface. The method includes forming a bottom metallic barrier material overlying the second dielectric layer surface and the bottom wiring structure surface. In a specific embodiment, the bottom metallic barrier material forms a metal-to-metal contact with the bottom wiring structure. The method deposits a contact material overlying the bottom wiring material and a switching material overlying the contact material. In a specific embodiment, a conductive material is formed overlying the switching material and a top barrier material is formed overlying the conductive material. In a specific embodiment, the method performs a patterning and etching process to form a plurality of pillar structures from at least the bottom metallic barrier material, the contact material, the switching material, the conductive material, and the top barrier material. In certain embodiments, the pillar structure is not aligned to the bottom wiring structure and maintains the metal-to-metal contact with the bottom wiring structure. A third dielectric material is formed overlying at least the plurality of pillar structures and the third dielectric material is planarized to expose a surface region of the pillar structure. The method then forms a top wiring structure including at least a second conductor material overlying at least the exposed surface region of the pillar structure.

Many benefits can be achieved by ways of the present invention. For example, the present invention provides a way to form a pillar structure for a switching device, which can be used in high density non-volatile memory devices. In a specific embodiment, the method provides a less stringent etching condition to form the pillar structure while maintaining electrical contact with a wiring structure for proper functioning of the switching device. In a specific embodiment, the present invention provides a high yield method for manufacturing high density memory devices. The metal-to-metal contact between the bottom wiring structure and the pillar structure relaxes a requirement for precise overlay of the pillar structure to the bottom wiring structure, which increases device yield. Additionally, the present method segments the fabrication of the device into forming of each of the orthogonal wire structures and the pillar structure. Etching of each of these pillar structures is easier as aspect ratio (ratio of height to width of a structure) of each of these pillar structures is reduced compared to etching the memory cell and wiring in one step. Additionally, filling gaps with respective dielectric material is also easier for reduced aspect ratios. Depending on the application, one or more of these benefits may be achieved. One skilled the art would recognize other variations, modifications, and alternatives.

SUMMARY OF THE DRAWINGS

FIGS. 1-17 are simplified diagrams illustrating a method of forming a memory device according to an embodiment of the present invention.

DETAILED DESCRIPTION OF THE PRESENT INVENTION

The present invention is generally related to a switching device. More particularly, embodiments of the present invention provide a structure and a method for forming a plurality of resistive switching devices each having a pillar structure. The present invention has been applied to fabrication of high density non-volatile memory devices. But it should be recognize that embodiments according to the present invention would have a much broader range of applicability.

FIGS. 1-17 illustrate a method of forming a switching device according to embodiments of the present invention. These diagrams are merely examples and should not unduly limit the claims herein. One skilled in the art would recognize other variations, modifications, and alternatives.

Figure 1:
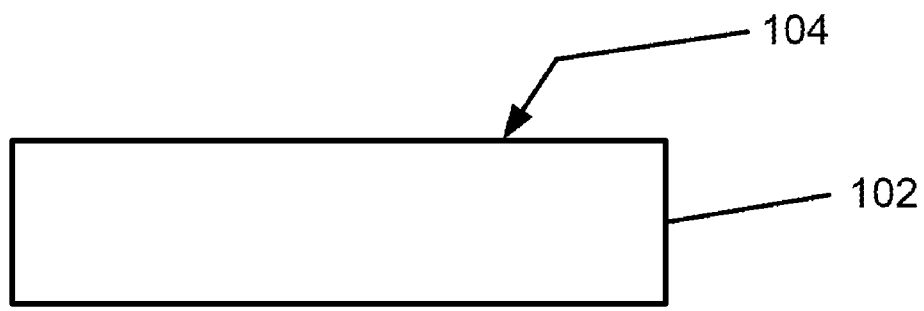

As shown in FIG. 1, a substrate 102 having a surface region 104 is provided. The substrate can be a semiconductor substrate in a specific embodiment. The semiconductor substrate can be a single crystal silicon wafer, a silicon germanium wafer, or a silicon-on-insulator substrate, commonly known as SOI, and the like, depending on the application. Depending on the embodiment, the substrate can have one or more devices such as one or more transistor devices formed thereon. The one or more devices may be operationally coupled to the switching device in a specific embodiment.

Figure 2:
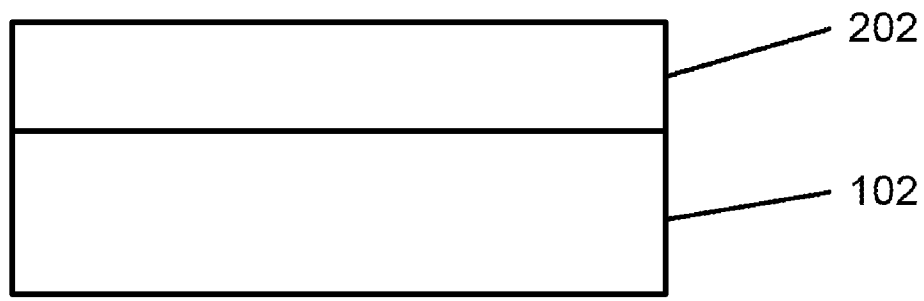

Referring to FIG. 2, the method forms a first dielectric material 202 overlying the surface region of the semiconductor substrate. The first dielectric material can be a suitable dielectric material such as silicon oxide, silicon nitride or combinations thereof depending on the embodiment. The first dielectric material can be deposited using techniques such as chemical vapor deposition (CVD) process including plasma enhanced chemical vapor deposition or low pressure chemical vapor deposition depending on the application. For example, silicon oxide may be formed using silane, disilane, a suitable chlorosilane or TEOS and other suitable silicon bearing materials, depending on the embodiment.

In a specific embodiment, the method forms a first adhesion layer 302 overlying the first dielectric material. The first adhesion layer can be titanium, titanium nitride, tantalum, tantalum nitride, or tungsten nitride or a combination of these. The first adhesion layer may be deposited using a physical vapor deposition process such as sputtering in a specific embodiment. Techniques such as a chemical vapor deposition using a suitable precursor may also be used. For example, adhesion layer 302 may be formed by first depositing a titanium metal on the first dielectric material, following by sputtering a titanium nitride material.

Figure 4:
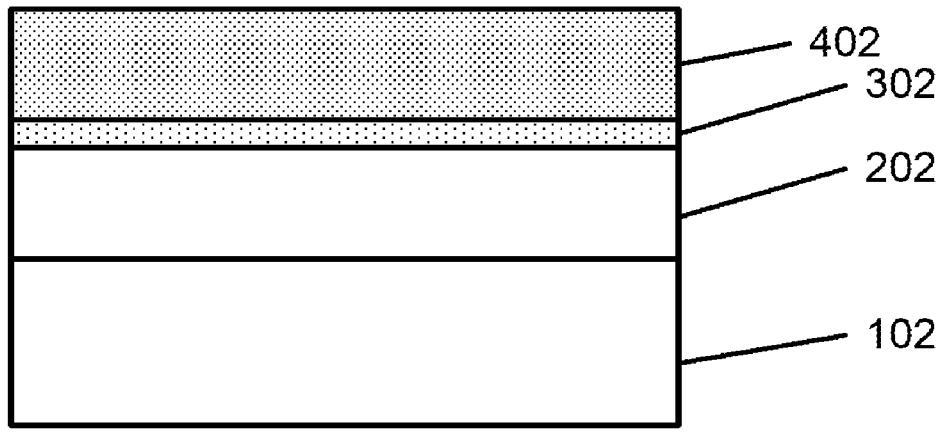

Referring to FIG. 4, the method forms a first wiring material 402 overlying the first adhesion layer. The first wiring material can be tungsten, copper, aluminum or other suitable metal materials including alloys. The first wiring material can be deposited using techniques such as physical vapor deposition, evaporation, chemical vapor deposition, electrochemical methods such as electroplating or electrode-less deposition from a liquid medium, or other suitable deposition techniques including a combination. In certain embodiments, the first wiring material can be a doped semiconductor material such as a doped silicon material. In a specific embodiment, the first adhesion layer functions as a glue layer between the first wiring material and the first dielectric layer. In a specific embodiment, tungsten is formed by sputtering on top of layer 302 to form layer 402. The tungsten may have a thickness of between 100 nm and 1000 nm thick, and preferably between 200 nm and 500 nm thick.

Figure 5:
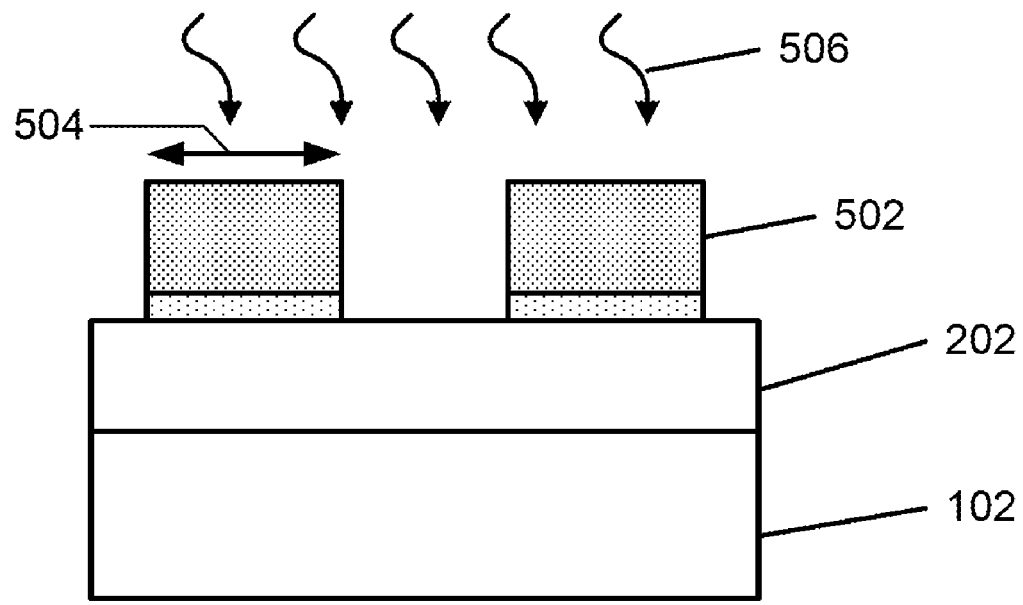

The method performs a first pattern and etch process 506 to form a first wiring structure 502 as shown in FIG. 5. The first wiring structure includes the first wiring material and the first adhesion material in a specific embodiment. As shown, the first wiring structure is characterized by a width 504. The first pattern and etch process includes forming a masking layer overlying the first wiring material followed by an etching process. The masking layer can be an organic photoresist material or a hard mask depending on the application. Taking tungsten as the first wiring material as an example, the first adhesion layer can be titanium nitride in a specific embodiment. The etching process can use a fluorine bearing species such as $CF_4$ as etchant in a specific embodiment. In a specific embodiment, the first wiring structure can have a width ranging from about 5 nm to about 1200 nm. In other embodiments, the width can range from about 30 nm to about 100 nm. Of course one skilled in the art would recognize other variations, modifications, and alternatives.

Figure 6:
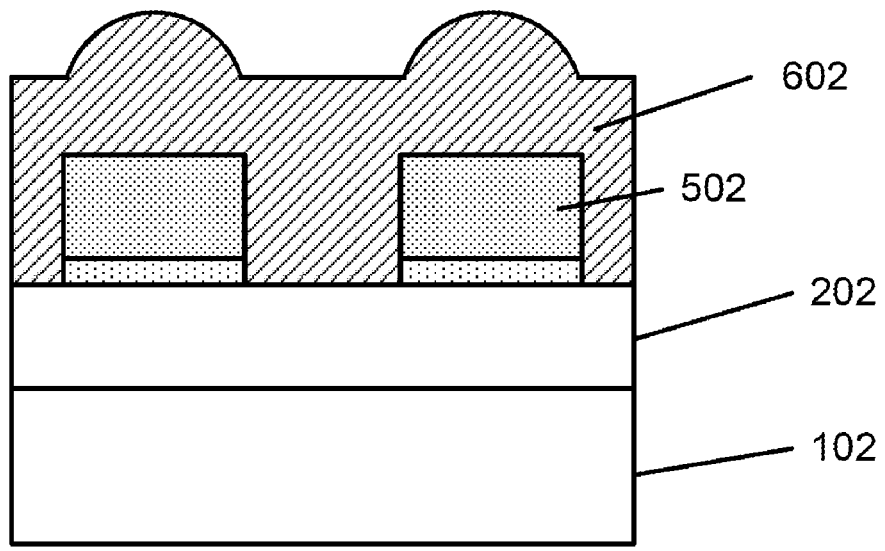

In a specific embodiment, the method includes forming a second dielectric material 602 overlying the first wiring structure as illustrated in FIG. 6. The second dielectric material can be silicon oxide, silicon nitride, or any suitable dielectric material including a dielectric stack and a combination of various dielectric materials depending on the embodiment. As merely an example, the second dielectric material can be a silicon oxide deposited using a plasma enhanced chemical vapor deposition (PECVD) process using tetra-ethyl oxysilicate (TEOS) as precursor in a specific embodiment. Other deposition method such as spin on glass followed by a suitable curing step may be used. Alternatively, a combination of more than one deposition processes may be used depending on the application.

Figure 7:
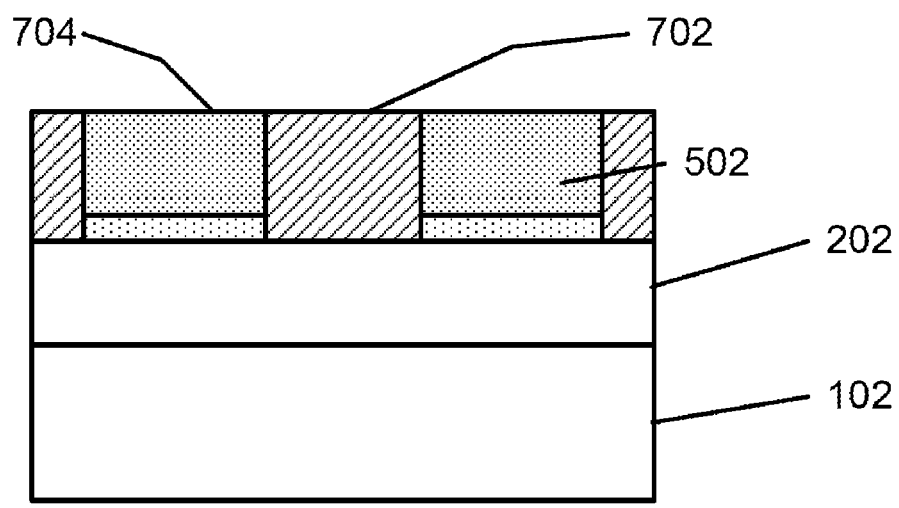

Referring to FIG. 7, the method includes performing a planarizing process to form a planarized second dielectric layer surface region 702 and expose a first wiring structure surface 704 in a specific embodiment. The planarizing process can be a chemical mechanical polishing (CMP) process using the first wiring (for example, tungsten) structure surface as a polishing stop in a specific embodiment. The planarizing process can be a selective etch process such as a reactive ion etching using the first wiring (for example, tungsten) structure surface as an etch stop in specific embodiment.

Figure 8:
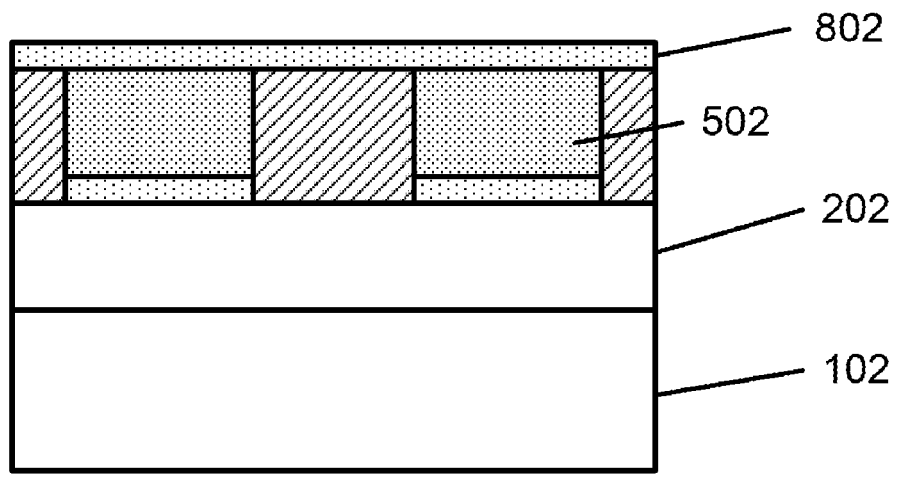

The method deposits a bottom metallic barrier material 802 overlying the planarized second dielectric layer surface region including the exposed first wiring structure surface as shown in FIG. 8. Bottom metallic barrier material 802 can be titanium, titanium nitride, tantalum, tantalum nitride, or tungsten nitride or a combination of these. The bottom metallic barrier material may be deposited using a physical vapor deposition process such as sputtering in a specific embodiment. Techniques such as a chemical vapor deposition using a suitable precursor may also be used.

Figure 9:
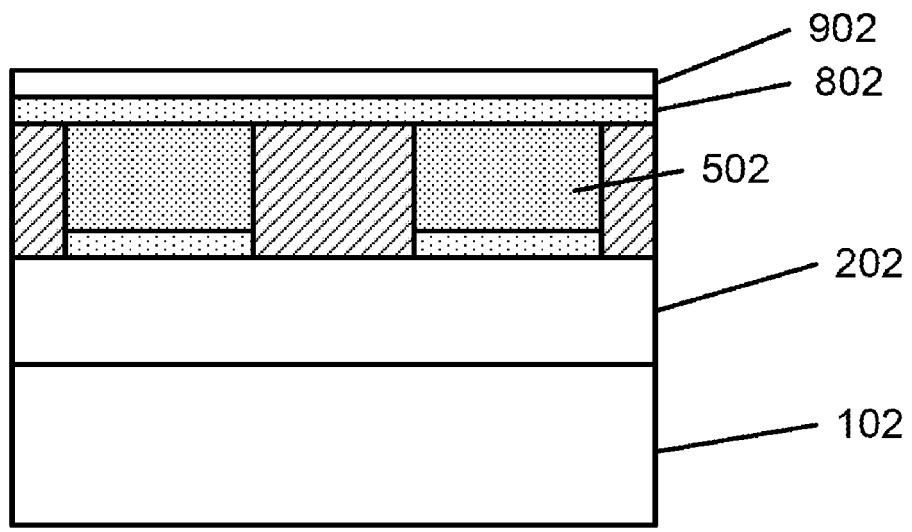

As shown in FIG. 9, the method includes depositing a contact layer 902 overlying the bottom metallic barrier material. In certain embodiments, the contact layer serves to control and improve switching for the switching device. For example for a switching device using amorphous silicon as the switching material, the contact layer can be a polysilicon material in a specific embodiment. The polysilicon material is p-doped using a boron bearing species at a boron atomic concentration ranging from about $1E18$ per $cm^3$ to about $1E22$ per $cm^3$ in a specific embodiment. In a specific embodiment, the polysilicon material is formed using a plasma enhanced chemical vapor deposition process or a low pressure chemical vapor deposition process and a silicon bearing species such as silane, disilane, a suitable chlorosilane, and others. The impurity species may be doped, in-situ, or ex-situ depending in the embodiment. Deposition temperature ranges from about 300 Degree Celsius to about 550 Degree Celsius depending on the embodiment. In an alternative embodiment, the contact layer can be a polycrystalline silicon germanium material having a p+ impurity characteristic. The polycrystalline silicon germanium material having the p+ impurity characteristic can be formed using a plasma enhanced chemical vapor deposition process or a low pressure chemical vapor deposition process, or others, using a suitable silicon precursor, a suitable germanium precursor, and a suitable p type impurity species. The silicon precursor can be silane, disilane, a suitable chlorosilane, and others. The germanium precursor can be germane (GeH$_4$), germanium chloride (GeCl$_4$), and other suitable germanium bearing species. The p+ impurity can be provided using a boron bearing species, an aluminum bearing species, a gallium bearing species, an indium bearing species, and others. Deposition temperature for the polycrystalline silicon germanium material having the p+ impurity characteristic can range from about 350 Degree Celsius to about 500 Degree Celsius and can be formed polycrystalline and dopant activated without subjecting to an anneal step.

Figure 10:
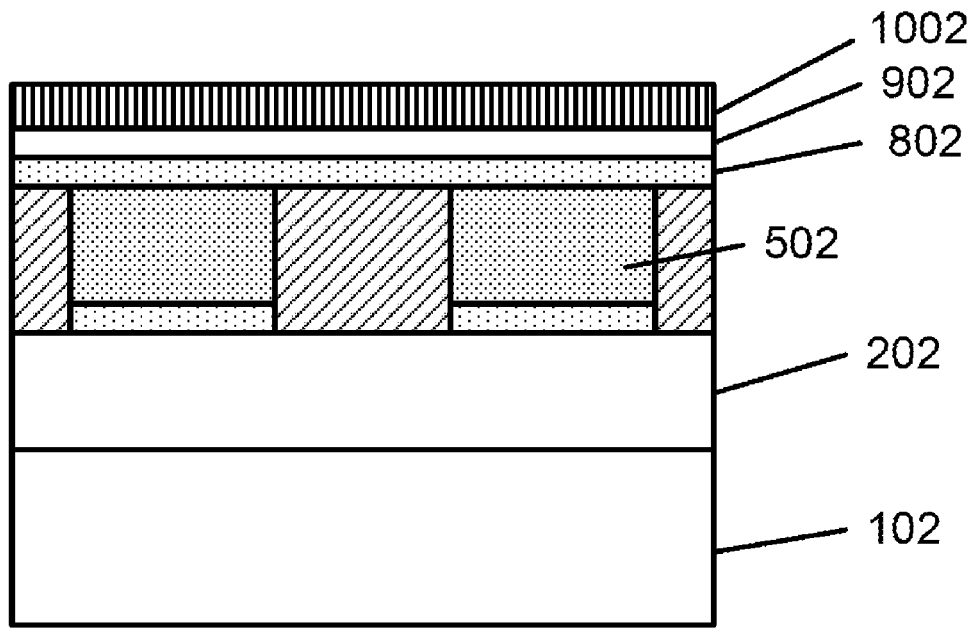

The method includes forming a switching material 1002 overlying the contact layer as shown in FIG. 10. The switching material can be an intrinsic amorphous silicon material, that is not intentionally doped, in a specific embodiment. The intrinsic amorphous silicon material can be deposited using a chemical deposition method or a physical deposition method depending on the embodiment. The chemical deposition method can include a chemical vapor deposition process using silane, disilane, a suitable chlorosilane, or a suitable silicon-containing gas as a precursor. In a specific embodiment, the intrinsic amorphous silicon material may be deposited using a plasma-assisted chemical deposition method. Deposition temperature for the amorphous silicon material can range from about 200 Degree Celsius to about 500 Degree Celsius and preferably at about 350 Degree Celsius to about 400 Degree Celsius. Depending on the embodiment, the amorphous silicon material can be provided at a thickness ranging from about 5 nm to about 100 nm. In a preferred embodiment, the amorphous silicon material is provided at a thickness ranging from about 10 nm to about 50 nm. Depending on the application, the amorphous silicon material may also be deposited using a physical vapor deposition such as sputtering using a suitablesilicon target material.

Figure 11:
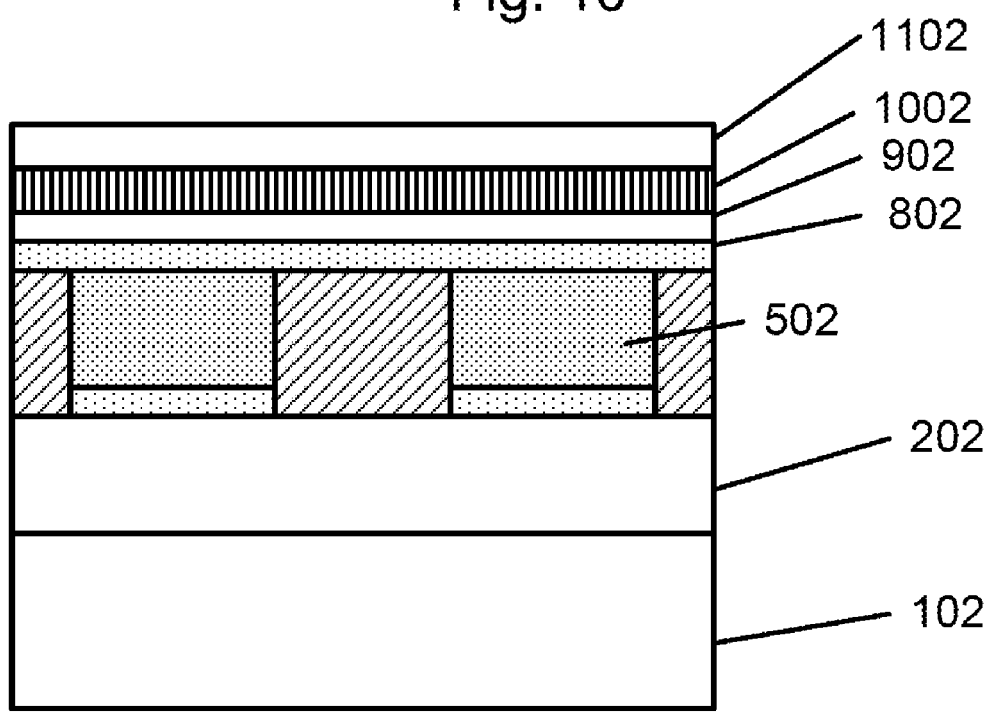

In a specific embodiment, the method deposits a conductive material 1102 overlying switching material as shown in FIG. 11. In a specific embodiment, for an amorphous silicon switching material, conductive material 1102 can comprise a silver material. The silver material can be deposited using a physical deposition process such as sputtering or evaporation. The silver material may also be formed using a chemical deposition process such as chemical vapor deposition, electrochemical such as electroplating, electrodeless deposition, or a combination depending on the application. The method deposits a top barrier material 1202 overlying the conductive material as shown in FIG. 12. Top barrier material 1202 layer can protect the conductive material, for example, the silver material, from oxidation in a specific embodiment. Top barrier material 1202 can also serve as a diffusion barrier between conductive material 1102 and subsequent materials, and forms an electrical contact between conductive material 1102 and subsequent materials. Top barrier material 1202 can also serve as a polish stop material in a subsequent step for a CMP process. Top barrier material 1202 can be titanium, titanium nitride, tantalum or tantalum nitride, tungsten, or tungsten nitride, or any suitable barrier material depending on the embodiment. Depending on the application, top barrier material 1202 can be formed using a chemical deposition such as atomic layer deposition, chemical vapor deposition, and others, or a physical deposition such as sputtering, depending on the application.

In a specific embodiment, the method includes subjecting a stack of material comprising the bottom metallic barrier material, the contact material, the switching material, the conductive material, and the top barrier material to a second pattern and etch process to form a plurality of pillar structures 1302 as shown in FIG. 13. Each of the pillar structure includes the bottom metallic barrier material, the contact material, the switching material, the conductive material, and the top barrier material. As shown, each of the pillar structure including the bottom metallic barrier material maintains a metal-to-metal contact 1304 with the first wiring structure in a specific embodiment. Depending on the embodiment, the pillar structure can be aligned to the bottom wiring structure as shown in FIG. 13a. The pillar structure may not be perfectly aligned to the first wiring structure as shown in FIG. 13b while maintaining the metal-to-metal contact in a specific embodiment.

Figure 14:
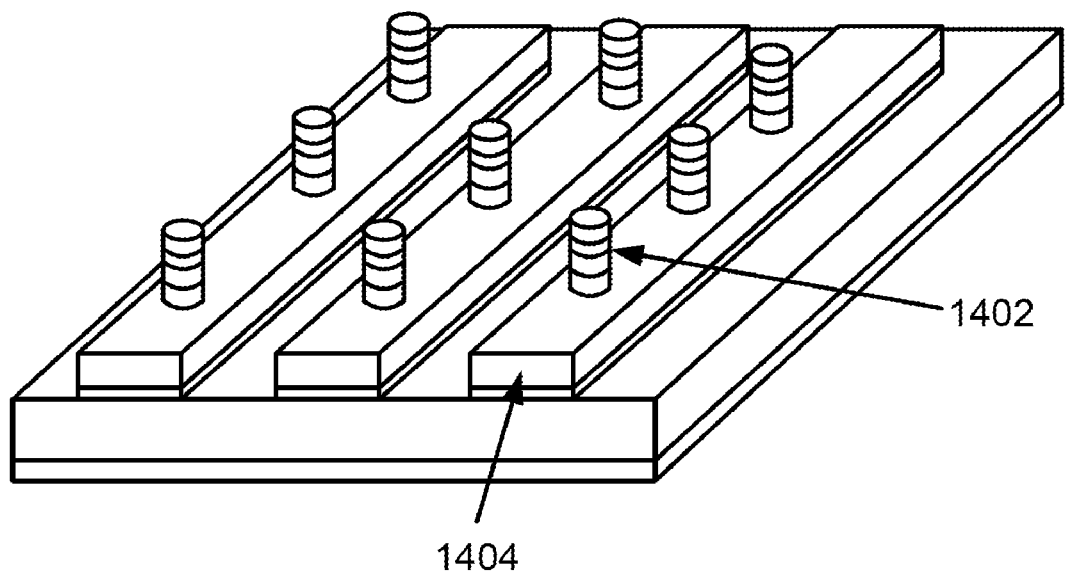
Figure 15:
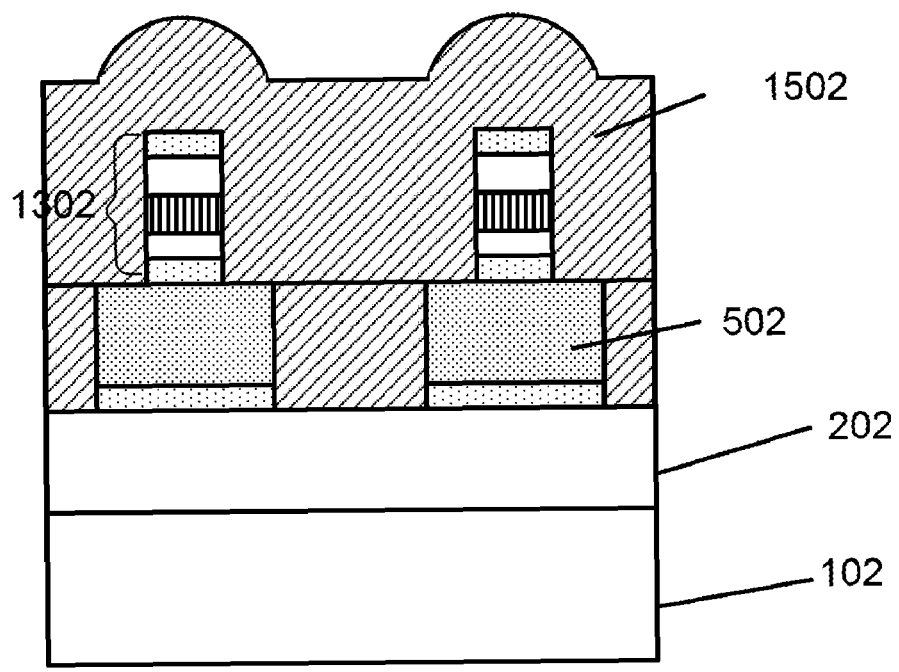

As merely an example, the pillar structure can have a feature size of less than about 250 nm and preferably about 90 nm, or even 40 nm, depending on the technology node adopted. The bottom wiring structure can have a width of about 90 nm or greater. The pillar structure with a bottom metallic barrier material enables a metal-to-metal contact with the first wiring structure even when there is a misalignment of the pillar structure to the first wiring structure during the second pattern and etch process in a specific embodiment. A perspective view of a plurality of pillar structures 1402 on the first wiring structure 1404 is illustrated in FIG. 14.

After forming the pillar structures, the method includes depositing a third dielectric material 1502 overlying at least the plurality of pillar structures including exposed regions of the first wiring structures. The third dielectric material can be silicon oxide, silicon nitride, or suitable dielectric material including a dielectric stack with a combination of various dielectric materials depending on the embodiment. As merely an example, the third dielectric material can be a silicon oxide deposited using a plasma enhanced chemical vapor deposition (PECVD) process using tetra-ethyl oxy-silicate as precursor in a specific embodiment. Other deposition method such as spin on glass followed by a suitable curing step may be used. Alternatively, a combination of deposition processes may be used depending on the application.

Figure 16:
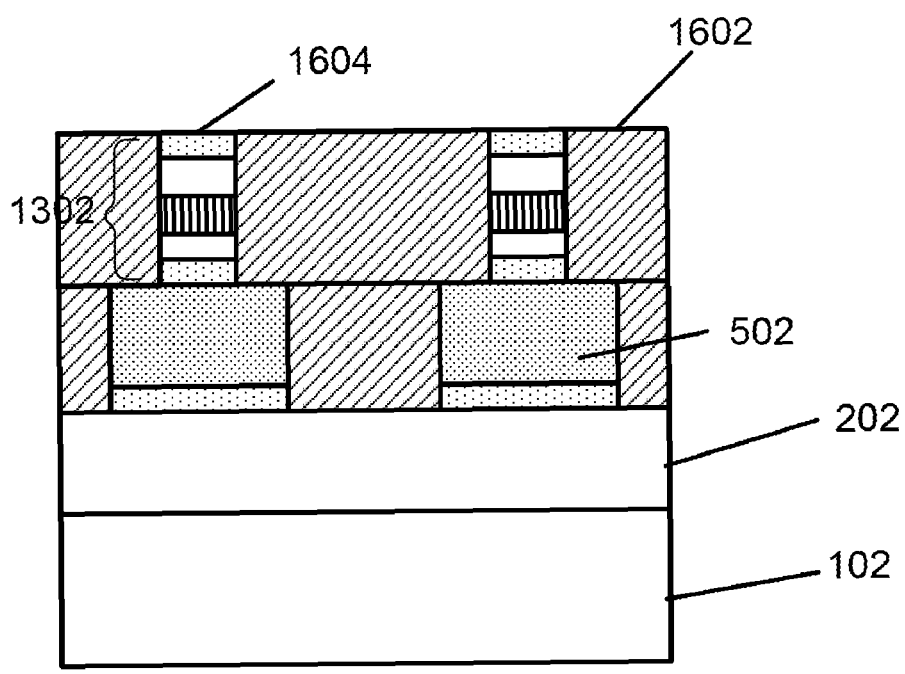

In a specific embodiment, the third dielectric layer is subjected to a planarizing process to form a planarized third dielectric layer surface 1602 and exposing a top surface region 1604 of the pillar structure as shown in FIG. 16. The exposed top surface region of the pillar structure includes a surface region of the top barrier material in a specific embodiment. The planarizing process can be a chemical mechanical polishing (CMP) process using the top barrier material as a polishing stop in a specific embodiment. The planarizing process can be a selective etch process such as a reactive ion etching using the top barrier material surface as an etch stop in specific embodiment. Of course one skilled in the art would recognize other modifications, variations, and alternatives.

Figure 17:
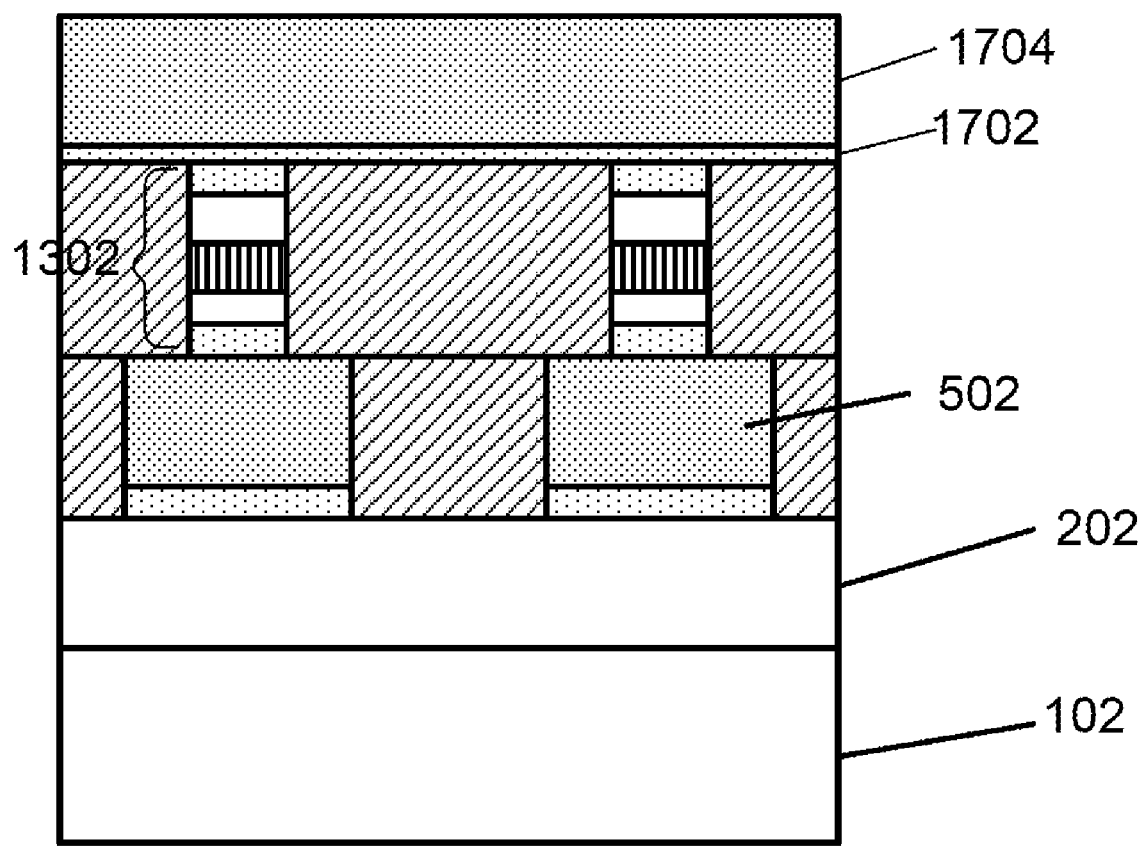
Figure 18:
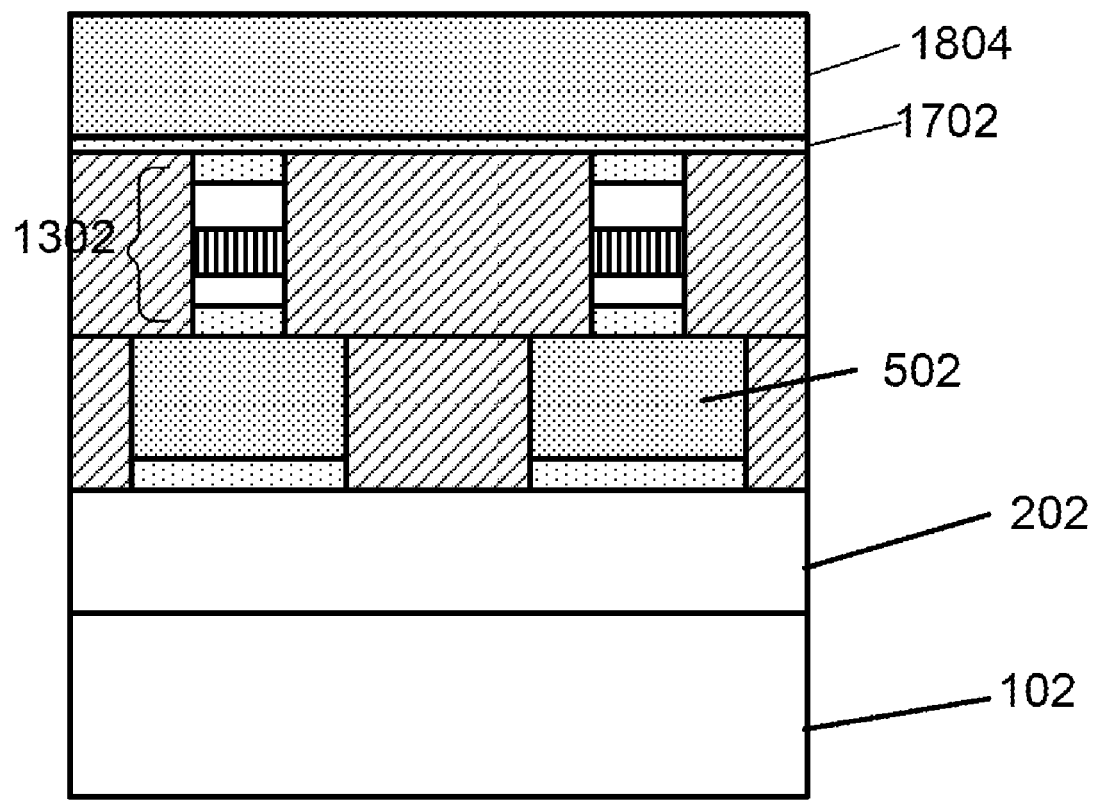
FIG. 18 is a simplified diagram illustrating a device structure for a switching device according to an embodiment of the present invention.

Referring to FIG. 17. The method includes depositing a second adhesion material 1702 overlying the planarized third dielectric layer surface and the top surface region of the pillar structure. The second adhesion layer can be titanium, titanium nitride, tantalum, tantalum nitride, or tungsten nitride or a combination of these. The second adhesion material may be deposited using a physical vapor deposition process such as sputtering in a specific embodiment. Techniques such as a chemical vapor deposition including atomic layer deposition using a suitable precursor may also be used. In a specific embodiment, the method deposits a top wiring material overlying the top contact material. The second wiring material can be tungsten, copper, aluminum or other suitable metal materials including alloys. The top wiring material can be deposited using techniques such as physical vapor deposition, evaporation, chemical vapor deposition, electrochemical methods such as electroplating or electrodeless deposition from a liquid medium, or other suitable deposition techniques including a combination. In certain embodiments, the top wiring material can be a doped semiconductor material such as a doped silicon material. In a specific embodiment, the second adhesion material functions as a glue layer between the top wiring material and the third dielectric layer. Taking tungsten as the second wiring material as an example. Tungsten can have a thickness ranging from about 100 nm to about 1000 nm and preferably ranging from about 200 nm to about 500 nm depending on the application. The method performs a third pattern and etch process to form a top wiring structure 1804 as shown in FIG. 18. The top wiring structure includes the top wiring material and the second adhesion material in a specific embodiment. In a specific embodiment, the top wiring structure is formed at an angle to the bottom wiring structure. In certain embodiments, the top wiring structure is formed orthogonal to the bottom wiring structure. Of course one skilled in the art would recognize other variations, modifications, and alternatives.

In a specific embodiment, the conductive material forms a plurality of conductive material particles including a filament structure in a portion of the switching material when a voltage, for example a forming voltage, is applied to the top wiring structure or the bottom wiring structure. The filament structure is characterized by a length dependent on an amplitude and polarity of a voltage applied to the top electrode or the bottom electrode. Formation of this filament changes the resistance of the switching material in a specific embodiment. Taking silver material as the conductive material and amorphous silicon as the switching material as an example, upon applying a positive voltage to the top wiring structure with respect to the bottom wiring structure, a plurality of silver particles are formed in regions of the amorphous silicon material. The plurality of silver particles can include a silver filament structure having a length. The length of the silver filament structure is caused to change upon applying a certain voltage (for example operating voltage such as write voltage or erase voltage), thus changing the resistance of the amorphous silicon material. Such a device structure is described in U.S. application Ser. No. 11/875,541, filed on Oct. 19, 2007, commonly assigned, and incorporated by reference in its entirety herein.

In a specific embodiment, the top wiring structure, the bottom wiring structure and the switching element sandwiched between the first wiring structure and the second wiring structure provide for a switching device for a non-volatile memory device. Of course one skilled in the art would recognize other variations, modifications, and alternatives.

Figure 3:
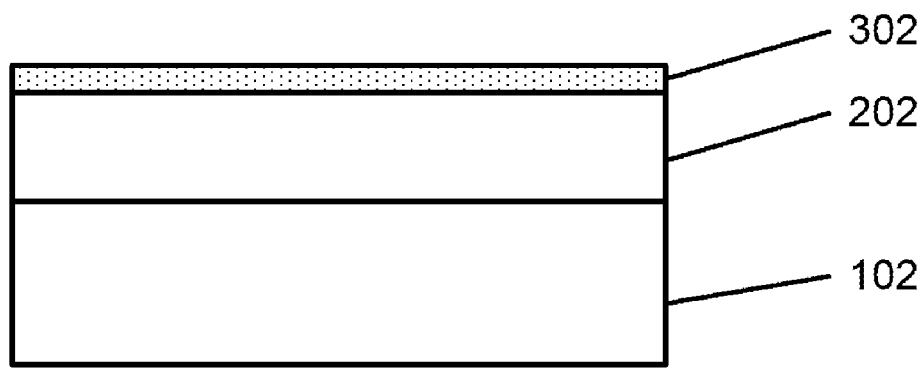
Figure 3A:
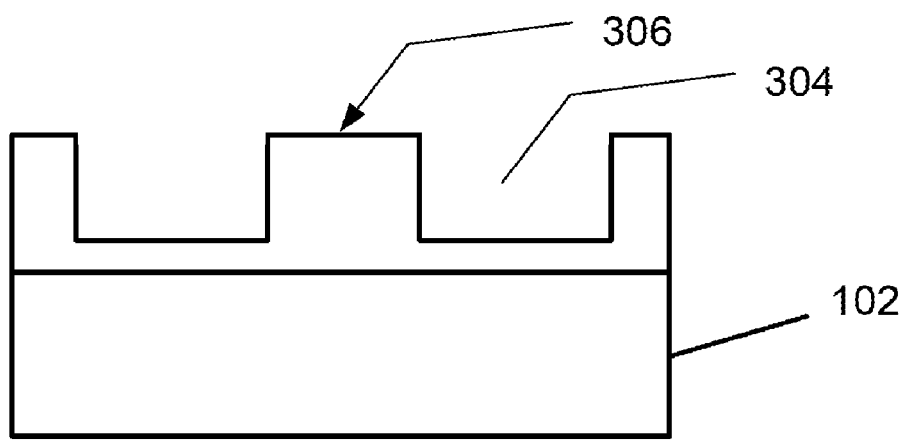
Figure 3B:
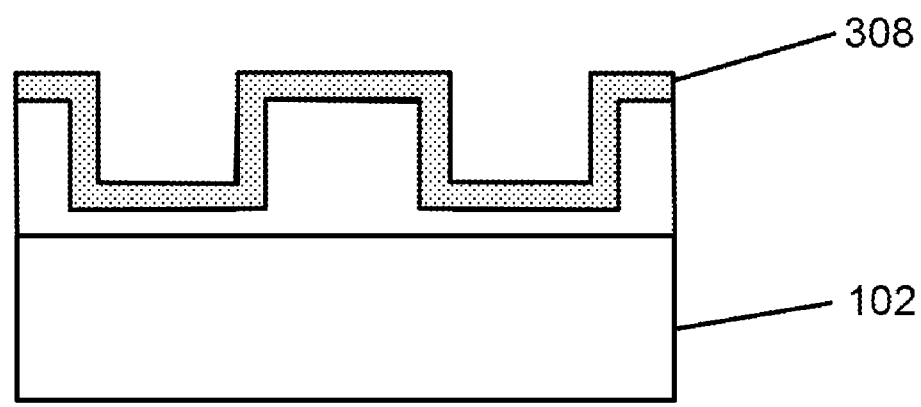
Figure 3C:
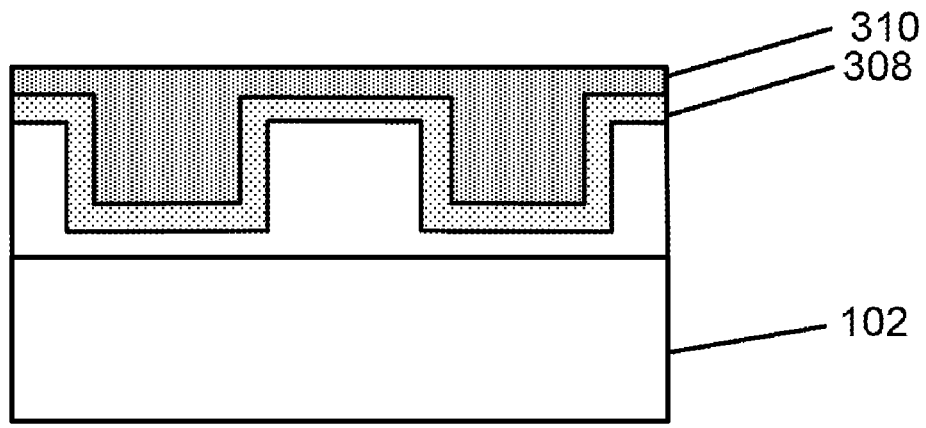
Figure 3D:
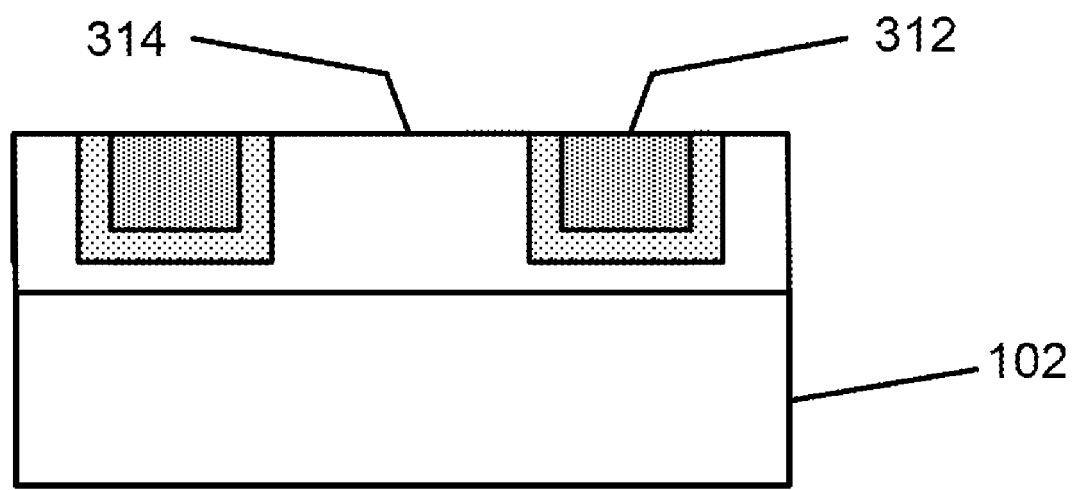

Depending on the embodiment, there can be variations. For example, the first wiring structure may be formed using a first damascene process as illustrated in FIGS. 3A, 3B, 3C, and 3D. The first damascene process includes forming one or more first trench openings 304 in a portion of first dielectric material 202 while a horizontal surface region 306 is exposed using a pattern and dielectric etch process. The one or more first trench openings are configured to extend in the first direction. A first adhesion material 308 is conformably formed overlying the one or more first trench openings including horizontal surface region 306 as shown in FIG. 3B. The first adhesion material can include titanium, titanium nitride, titanium tungsten, tantalum, tantalum nitride, and others, including any combination of these. First wiring material 308 (for example, copper, tungsten, or aluminum) is formed overlying the first adhesion material and to fill each of the one or more trench openings as shown in FIG. 3C. The first wiring material including the first adhesion material is subjected to a first chemical mechanical polishing process to remove the first wiring material and the first adhesion material from the horizontal surface region of the first dielectric material to form one or more first wiring structures 312 and to isolate each of the first wiring structures in a specific embodiment. As shown, the chemical mechanical polishing process also expose surface region 314 of the first dielectric material in a specific embodiment. The method then proceeds to form a bottom metallic barrier material 802 overlying first dielectric surface region 314 and first wiring structure 312 as in FIG. 8 and rest of the process steps in FIG. 9-18.

Similarly, the second wiring structure may be formed using a second damascene process substantially the same as the first damascene process by forming a second trench opening in the third dielectric material (Reference 1502 in FIG. 15) overlying each of structure 1302. The second trench openings are back filled using the second wiring material. The second trench opening is configured to extend in a second direction as in FIG. 18. Of course one skill in the art would recognize other modifications, variations, and alternatives. It is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A method of forming a pillar structure for a memory device, comprising:

providing a semiconductor substrate having a surface region;

forming a first dielectric layer overlying the surface region of the semiconductor substrate;

forming a first wiring structure overlying the first dielectric layer, the first wiring structure comprising at least a first conductor material;

forming a second dielectric material overlying the first wiring structure;

forming a planarized second dielectric layer surface, exposing a first wiring structure surface;

forming a bottom metallic barrier material overlying the second dielectric layer surface including the first wiring structure surface, the bottom metallic barrier forming a metal-to-metal contact with the first wiring structure;

depositing a contact material overlying the bottom metal barrier material;

depositing a switching material overlying the contact material;

depositing a conductive material overlying the switching material;

depositing a top barrier material overlying the conductive material;

performing a patterning and etching process to form a plurality of pillar structures from at least the bottom metallic barrier material, the contact material, the switching material, the conductive material, and the top barrier material;

depositing a third dielectric material overlying at least the plurality of pillar structures, the third dielectric material having a non-planer surface region;

planarizing the third dielectric material, exposing a surface region of the pillar structure, the surface region of the pillar structure including a surface region of the top barrier material, and forming a top wiring structure overlying at least the exposed surface region of the pillar structure, the top wiring structure comprising at least a second conductor material.

2. The method of claim 1 wherein each of the plurality of pillar structure is aligned to the first wiring structure to maintain the metal-to-metal contact with the first wiring structure.

3. The method of claim 1 wherein each of the plurality of pillar structure is not aligned to the first wiring structure while the bottom metallic barrier material maintaining the metal-to-metal contact with the first wiring structure.

4. The method of claim 1 wherein the semiconductor substrate includes one or more COMS device formed thereon, the one or more CMOS devices being operationally coupled to the memory device.

5. The method of claim 1 wherein the first dielectric layer is silicon oxide, or silicon nitride or a high K dielectric, and including combinations of these.

6. The method of claim 1 wherein the first wiring structure and the second wiring structure each comprises at least tungsten, aluminum, copper, or a doped semiconductor material.

7. The method of claim 1 wherein the second dielectric material comprises silicon oxide, silicon nitride, or a combination.

8. The method of claim 7 wherein the second dielectric material is deposited using chemical vapor deposition (CVD) including plasma enhanced CVD, low pressure CVD, and atmosphere pressure CVD, and spin-on-glass, and any combination of these.

9. The method of claim 1 wherein the bottom metallic barrier material and the top contact material each comprises an adhesion material, the adhesion material is selected from: titanium, titanium nitride, tantalum, tantalum nitride, tungsten, and tungsten nitride, or a combination of these.

10. The method of claim 9 wherein the adhesion material is formed using a physical vapor deposition process, or a chemical vapor deposition process, an atomic layer deposition process, or a combination.

11. The method of claim 9 wherein the bottom metallic barrier material comprises titanium nitride or tungsten nitride having a thickness ranging from about 5 nm to about 100 nm.

12. The method of claim 9 wherein the bottom metallic barrier material comprises titanium nitride or tungsten nitride having a thickness ranging from about 10 nm to about 35 nm.

13. The method of claim 9 wherein the top barrier material comprises titanium nitride or tungsten nitride having a thickness ranging from about 5 nm to about 100 nm.

14. The method of claim 9 wherein the top barrier material comprises titanium nitride or tungsten nitride having a thickness ranging from about 20 nm to about 60 nm.

15. The method of claim 1 wherein the contact material comprises a polysilicon material.

16. The method of claim 15 wherein the polysilicon material has a heavily p-doped impurity characteristic, the p-doped impurity characteristic being provided by a boron species at an atomic concentration ranging from about 1E18 per $cm^3$ to about 1E22 per $cm^3$.

17. The method of claim 15 wherein the polysilicon material is deposited using a plasma enhanced chemical deposition process at a temperature ranging from about 320 Degree Celsius to about 550 Degree Celsius.

18. The method of claim 15 wherein the polysilicon material is deposited using a low pressure chemical deposition process at a temperature ranging from about 350 Degree Celsius to about 450 Degree Celsius.

19. The method of claim 15 wherein the polysilicon material has a thickness ranging from about 10 nm to about 100 nm.

20. The method of claim 15 wherein the polysilicon material has a thickness ranging from about 10 nm to about 45 nm.

21. The method of claim 1 wherein the contact material comprises a p+ polycrystalline silicon germanium material.

22. The method of claim 1 wherein the switching material comprises an amorphous silicon material having an intrinsic semiconductor characteristic.

23. The method of claim 22 wherein the amorphous silicon material is formed using a plasma enhanced chemical deposition process or a low pressure chemical deposition process at a temperature ranging from about 360 Degree Celsius to about 420 Degree Celsius.

24. The method of claim 22 wherein the amorphous silicon material has a thickness ranging from about 10 nm to about 100 nm.

25. The method of claim 22 wherein the amorphous silicon material has a thickness ranging from about 20 nm to about 50 nm.

26. The method of claim 1 wherein the conductive material comprises a silver material, or a gold material, or a platinum material, or a palladium material, or their respective alloy, or any combination of these.

27. The method of claim 26 wherein the silver material is deposited using a physical vapor deposition process or a chemical vapor deposition process or a electrochemical deposition process including electroplating or electrodeless plating or any combination of these.

28. The method of claim 26 wherein the silver material has a thickness ranging from about 5 nm to about 75 nm.

29. The method of claim 26 wherein the silver material has a thickness ranging from about 15 nm to about 40 nm.

30. The method of claim 1 wherein each of the plurality of pillar structure comprises at least a switching element.

31. The method of claim 1 wherein forming the planarized second dielectric material surface comprises an anisotropic etching process including an etch back process, a chemical mechanical polishing process, and any combination of these, the first wiring structure is used as an etch stop or a polish stop.

32. The method of claim 1 wherein planarizing the third dielectric material comprises an anisotropic etching process including an etchback process, a chemical mechanical polishing process, and any combination of these, the top barrier material is used as an etch stop or a polish stop.

33. The method of claim 1 wherein the top wiring structure and the bottom wiring structure are spatially configured in at an angle to each other.

34. The method of claim 1 wherein the switching material is characterized by a resistance dependent upon a voltage applied to the top wiring structure or the bottom wiring structure.

35. The method of claim 34 wherein the voltage applied to the top wiring structure causes a plurality of conductive particles derived from the conductive material to form in the switching material.

36. The method of claim 35 wherein the plurality of conductive particles comprise a filament structure having a length dependent on an amplitude and a polarity of the voltage applied to the top wiring structure or the bottom wiring structure.

* * * * *